United States Patent [19]
Martin et al.

[11] Patent Number: 5,453,660
[45] Date of Patent: Sep. 26, 1995

[54] BI-CHANNEL ELECTRODE CONFIGURATION FOR AN ADDRESSING STRUCTURE USING AN IONIZABLE GASEOUS MEDIUM AND METHOD OF OPERATING IT

[75] Inventors: Paul C. Martin, Vancouver, Wash.; Thomas S. Buzak, Aloha, Oreg.

[73] Assignee: Tektronix, Inc., Wilsonville, Oreg.

[21] Appl. No.: 307,500

[22] Filed: Sep. 15, 1994

Related U.S. Application Data

[63] Continuation of Ser. No. 935,607, Aug. 26, 1992, abandoned.

[51] Int. Cl.$^6$ ............................... G09G 3/00; H01J 17/49
[52] U.S. Cl. ..................... 313/582; 313/631; 345/60; 315/169.4
[58] Field of Search ..................... 313/582, 583, 313/584, 585, 586, 505, 630, 631, 633; 315/169.4; 345/87, 60, 62

[56] References Cited

U.S. PATENT DOCUMENTS

| | | | |
|---|---|---|---|
| 3,262,010 | 7/1966 | Kazan | 315/63 |
| 3,812,486 | 5/1974 | Purchase | 340/324 M |
| 4,038,577 | 7/1977 | Bode et al. | 313/586 |
| 4,319,239 | 3/1982 | Stephens | 340/784 |
| 4,322,659 | 3/1982 | De Jule et al. | 315/169.1 |
| 4,352,101 | 9/1982 | De Jule | 340/769 |
| 4,395,244 | 7/1983 | Glaser | 445/25 |
| 4,554,482 | 11/1985 | Kamegaya et al. | 313/582 |
| 4,780,644 | 10/1988 | Sakai et al. | 313/582 |
| 4,896,149 | 1/1990 | Buzak et al. | 340/794 |
| 4,963,788 | 10/1990 | King et al. | 313/505 |
| 5,077,553 | 12/1991 | Bozak et al. | 345/7 |
| 5,107,182 | 4/1992 | Sano et al. | 315/169.4 |
| 5,138,225 | 8/1992 | Kim | 313/582 |
| 5,159,238 | 10/1992 | Koiwa et al. | 313/582 |

FOREIGN PATENT DOCUMENTS

| | | | |
|---|---|---|---|
| 0495331 | 3/1992 | Japan | 313/582 |

OTHER PUBLICATIONS

Mikoshiba, Shigeo, "Plasma Displays," Seminar 10, SID 1987, 10.2–10.37.
Dick, George W., "Plasma Display Panel Techniques," Seminar 2, SID 1985 2.2–1–2.2–54.

*Primary Examiner*—Tommy P. Chin
*Assistant Examiner*—Kara A. Farnandez
*Attorney, Agent, or Firm*—Richard B. Preiss; John D. Winkelman

[57] ABSTRACT

An electrode structure (100) for an addressing structure using an ionizable gaseous medium has a substrate (102) and a cover (126). A plurality of channel-defining portions (116, 118, 120, 122, 124) each extend from the substrate to the cover; each pair of adjacent channel-defining portions defines a plasma discharge channel (129, 131, 133, 135, 137) for the ionizable gaseous medium. An electrode (104, 106, 108, 110, 112) extends through each channel-defining portion so that the electrode has a surface exposed to each of the channels defined in part by the channel-defining portion. Each of the channel defining portions or walls separates each electrode from the cover. An addressing structure using the electrode structure of the invention ionizes the gas in each channel by driving the electrodes of the pair of adjacent channel-defining portions that define the channel.

12 Claims, 10 Drawing Sheets

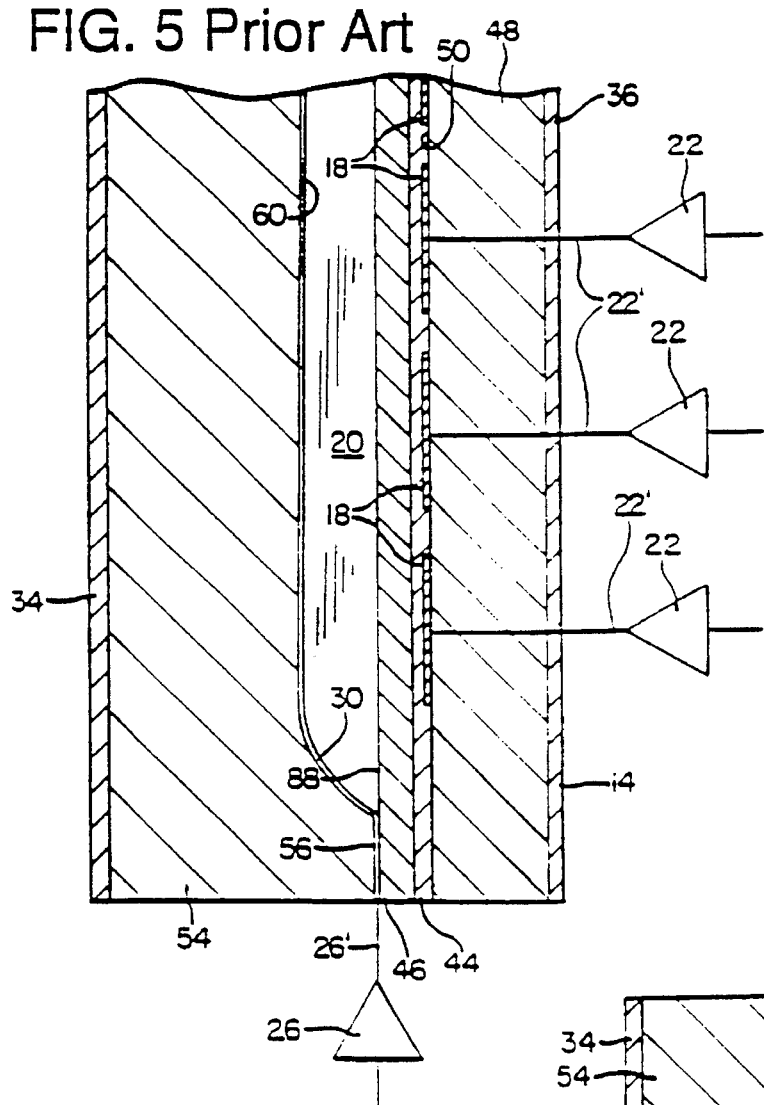
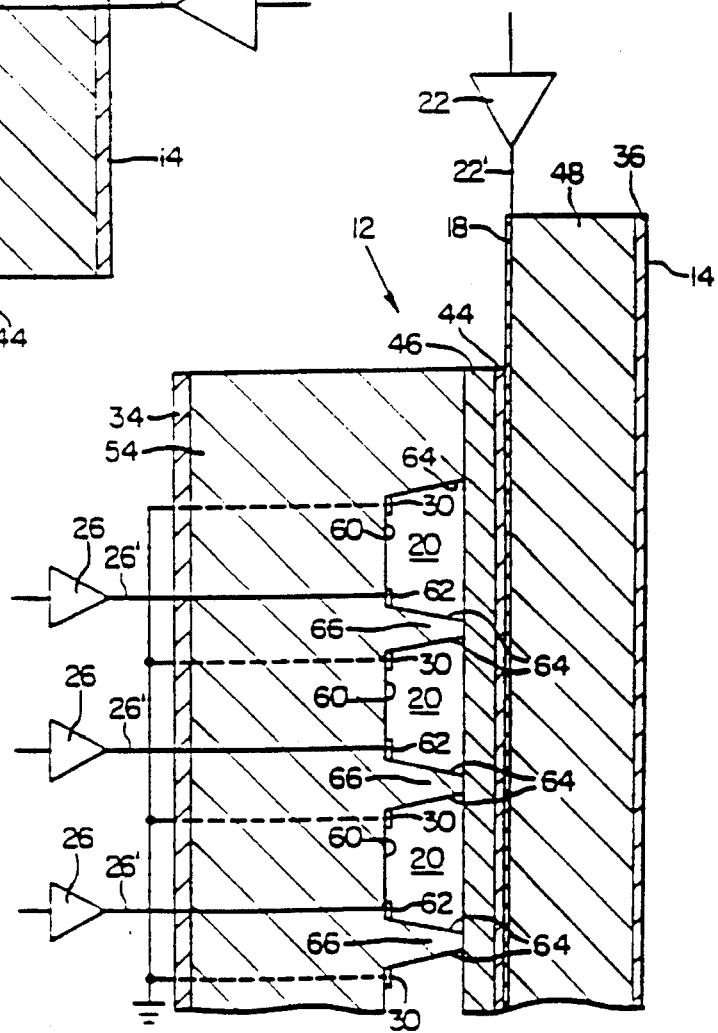

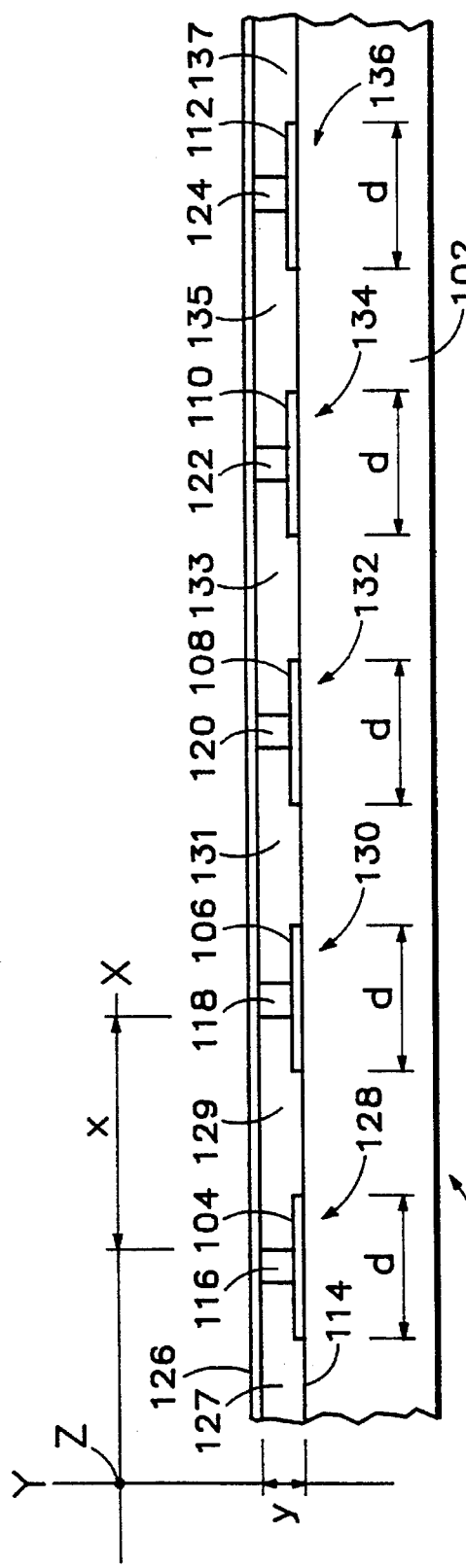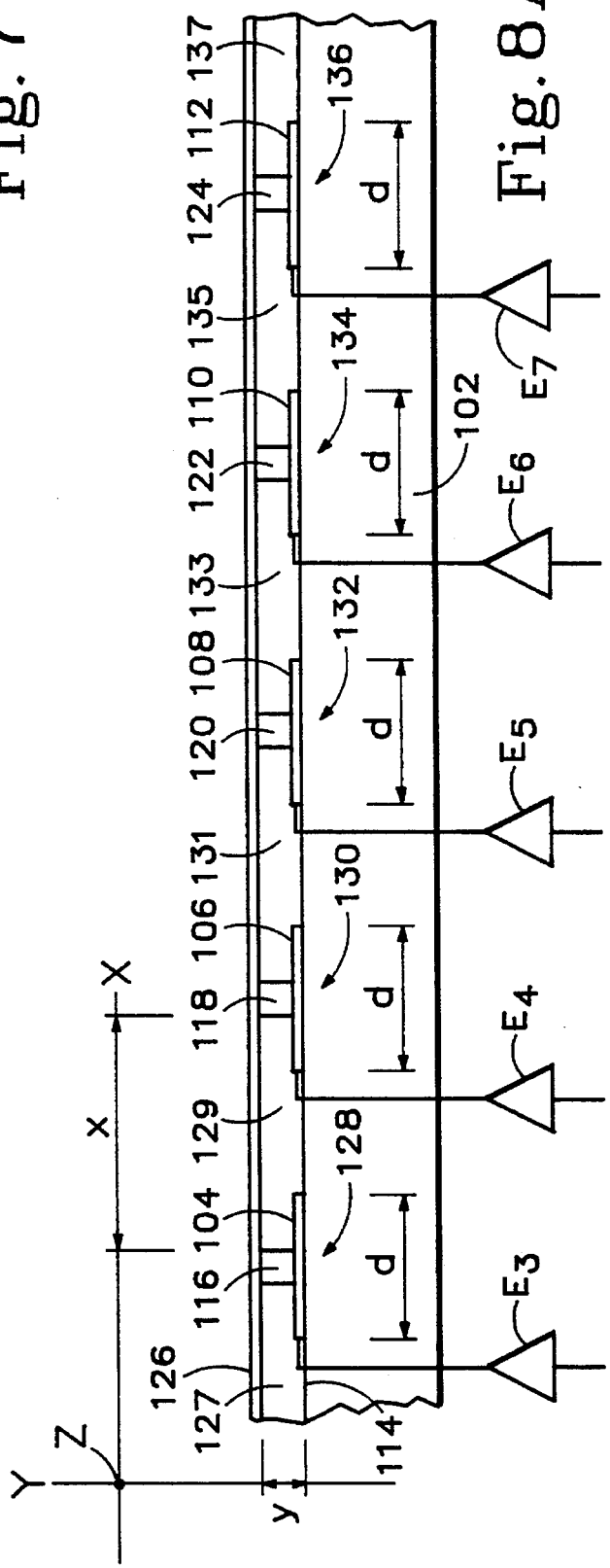

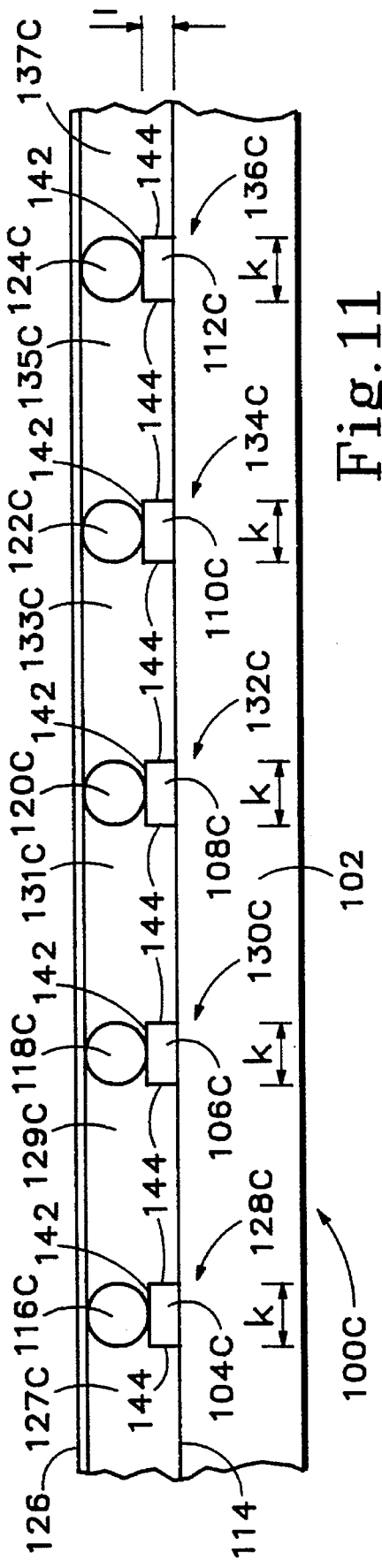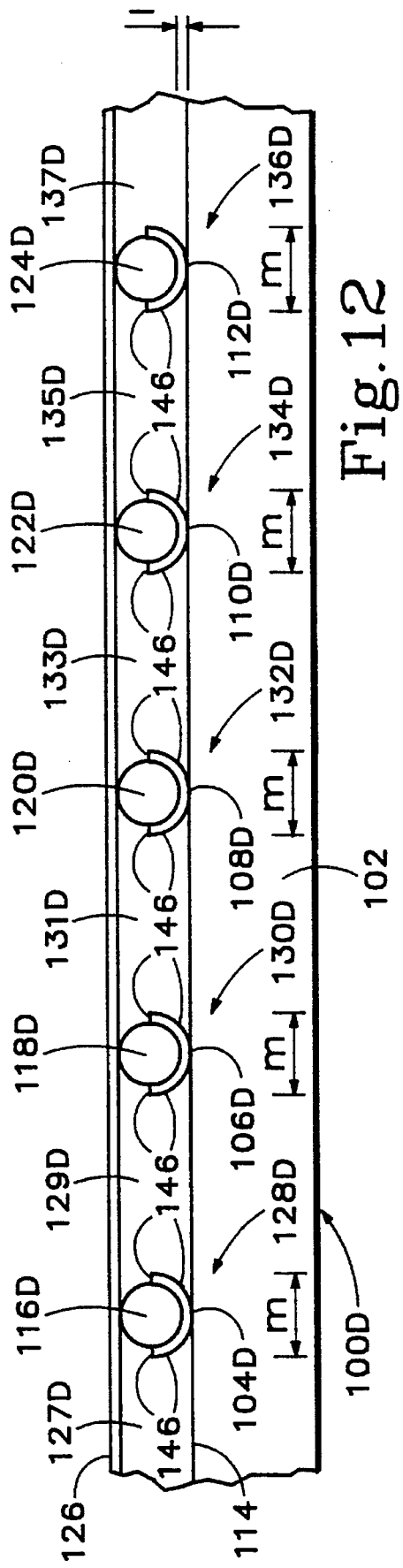

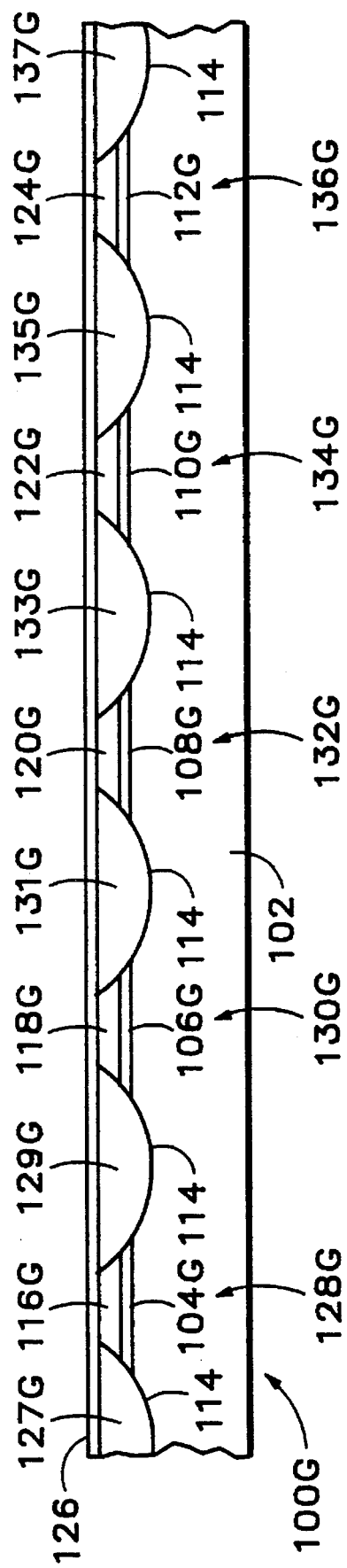

BI-CHANNEL ELECTRODE CONFIGURATION FOR AN ADDRESSING STRUCTURE USING AN IONIZABLE GASEOUS MEDIUM AND METHOD OF OPERATING IT

This is a continuation of U.S. patent application Ser. No. 07/935,607, filed Aug. 26, 1992, now abandoned.

TECHNICAL FIELD

The present invention pertains to electrode structures in systems constructed of data storage elements which employ an ionizable gas to address an array of such storage elements.

BACKGROUND OF THE INVENTION

U.S. Pat. No. 4,896,149, issued Jan. 23, 1990 ("'149 Patent"), discloses an addressing structure using an ionizable gaseous medium. Such an addressing structure may be used in a system constructed of data storage elements which addresses those data storage elements with the use of an ionizable gas. An example of such a system is a flat panel display, a video camera, or a memory system.

The system disclosed in the '149 Patent has an electrode structure which defines rows of channels, each of which is filled with an ionizable gas. Extending along the base of each of those channels are a row electrode and a reference electrode. The row electrode is electrically driven as a cathode, and the reference electrode is referenced to ground and acts as an anode when the row electrode is electrically driven as a cathode. When a particular row electrode is driven as a cathode, the ionizable gas in the particular channel which contains that row electrode is ionized, and the system operates as disclosed in the '149 Patent.

In manufacturing the electrode structure disclosed in the '149 Patent the yield is unsatisfactory for commercial purposes. The base of each channel of the electrode structure should have row and reference electrodes of relatively narrow widths in comparison with the width of the base. This is so because the electrode structure depends on light transmission through the bases of its channels, and the row and reference electrodes in each channel cannot unduly obstruct the passage of light.

It is easier to manufacture wide electrodes than to manufacture narrow electrodes. However, for many applications it is undesirable to compromise viewing quality by increasing the width of the electrodes. For such applications the use of narrow electrodes reduces the manufacturing yield, and thus increases the manufacturing cost, of the electrode structure. This problem is particularly acute for those applications in which a large number of channels, each with its pair of electrodes, must be formed.

There is thus a need to find a way of achieving a higher manufacturing yield of electrode structures suitable for use in a system of the type disclosed in the '149 Patent.

SUMMARY OF THE INVENTION

An object of the present invention is, therefore, to provide an electrode structure for a system of the type disclosed in the '149 Patent that can be manufactured at a higher yield than the electrode structure disclosed in the '149 Patent.

Another object of this invention is to simplify the use of standard fabrication techniques in the manufacture of such an electrode structure.

The invention provides a new and improved electrode structure for an addressing structure using an ionizable gaseous medium. The electrode structure of the invention can be manufactured using standard fabrication techniques at a higher production yield than the electrode structure disclosed in the '149 Patent.

An electrode structure according to the invention has an electrically insulating substrate and a dielectric cover. A number of nonintersecting channel-defining portions extend between the substrate and the cover. Each pair of adjacent channel-defining portions defines a plasma discharge channel which is bounded by the substrate, one side of one of the pair, the cover, and one side of the other of the pair.

Each channel defining portion includes an electrode having one surface which forms part of one side, and another surface which forms part of the other side, of the channel-defining portion. Each channel-defining portion also includes a wall between the electrode and the cover. The electrodes which carry the current to ionize the ionizable gas contained in each plasma discharge channel are thus (1) the electrode included in one of the pair of adjacent channel-defining portions which define the channel and (2) the electrode included in the other of the pair.

This aspect of the invention meets the technical objectives set forth above by reducing the number of electrodes by half and combining into one structure the electrode and the wall which separates adjacent plasma discharge channels.

The invention includes a wide variety of alternative electrode structures. A first embodiment has a relatively wide electrode and a narrower wall.

A second embodiment has an electrode including (1) a relatively narrow conduction bus formed of a more-conductive but less optically transparent substance (for example, a metal) and (2) a relatively wide distribution bus formed of a more-transparent but less-conductive substance (for example, indium tin oxide) electrically coupled to the conduction bus. This embodiment improves the contrast of an image presented by a display device by permitting more light to pass through the electrode structure.

A third embodiment has a relatively narrow electrode located directly underneath the wall.

A fourth embodiment has an electrode in contact with a fiber (such as an optical fiber) which constitutes the wall. In this embodiment the electrode is again relatively narrow.

A fifth embodiment has an electrode adhering to part of the surface of a fiber (such as an optical fiber) which constitutes the wall.

In the two immediately preceding embodiments the electrode may be formed of a substance which is adequately conductive and which bonds to the substrate and the wall. As an example, fused nickel paste frits can be adequately conductive and bond glass fiber to a glass substrate.

In a sixth embodiment each successive electrode is alternately wide and narrow. The wall connects each such electrode with the cover. The wide electrodes are preferably of a substance (for example, indium tin oxide) transparent to light.

A seventh embodiment has each successive electrode alternately wide and narrow. In this embodiment the wide electrodes comprise a distribution bus formed of a more-transparent but less-conductive material (such as indium tin oxide) electrically coupled to a conduction bus formed of a more-conductive but less-transparent material (such as a metal). The narrow electrodes in this embodiment are preferably formed of metal.

An eighth embodiment is formed by a subtractive process (for example, by chemical etching). A workpiece has a layered structure with a lower insulating layer, a middle conductive layer, and an upper insulating layer. Material is removed from each of these three layers, leaving rows of channel-defining portions defining nonintersecting plasma discharge channels. The middle layer defines the electrodes of the structure.

A drive scheme is implemented to operate an electrode structure with adjacent channels having a common electrode. This is accomplished by applying to the electrodes of a selected channel and its adjacent channels a sequence of drive signals of sufficient potential difference to initiate plasma discharge during a row scan period in the selected channel but of insufficient potential difference to initiate or sustain plasma discharge in the adjacent channels. The drive signal for the selected channel changes the potential difference applied toward the end of the row scan period to reduce the plasma decay time and thereby minimize crosstalk.

The circuitry which drives the electrodes may be manufactured on the substrate. As an example, if the substrate portion is glass, the driving circuitry is formed of polysilicon on the glass.

Additional objects and advantages of the present invention will be apparent from the detailed description of preferred embodiments thereof, which proceeds with reference to the accompanying drawings.

BRIEF DESCRIPTION OF THE DRAWINGS

FIG. 4 is an enlarged sectional view taken along lines 4—4 of FIG. 3.

FIG. 5 is an enlarged sectional view taken along lines 5—5 of FIG. 3.

FIG. 7 is a fragmentary cross-sectional view of a first embodiment of an improved electrode structure according to the invention.

FIG. 8A is a diagram showing the output amplifiers that deliver drive signals to the common channel electrodes of FIG. 7.

FIGS. 9–15 are fragmentary cross-sectional views of seven alternative embodiments of an improved electrode structure according to the invention.

DETAILED DESCRIPTION OF PREFERRED EMBODIMENTS

The following discussion with reference to FIGS. 1–6 is taken from the '149 Patent to provide background for the description of the present invention. The figure numbers used in the following discussion are the same as those of the present disclosure.

Figure 1:
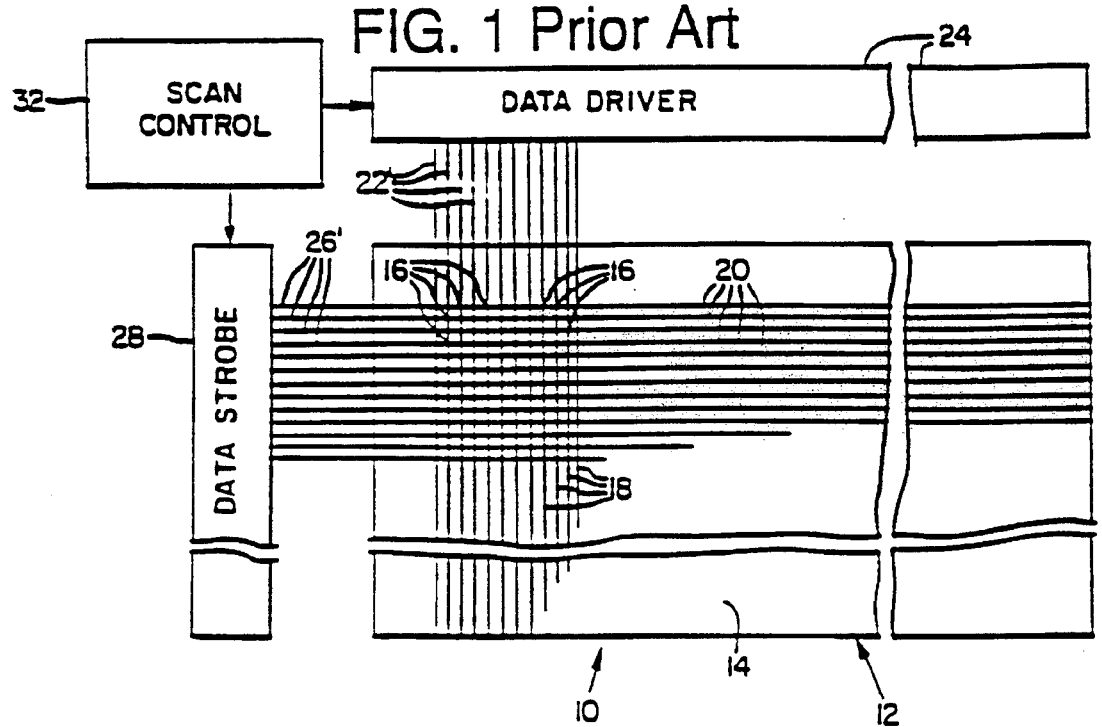
FIG. 1 is a diagram showing a frontal view of the display surface of a display panel and associated drive circuitry of a display system described in the '149 Patent.

FIG. 1 shows a flat panel display system 10, which represents a first embodiment that implements the addressing structure and carries out the addressing method of the '149 Patent. With reference to FIG. 1, flat panel display system 10 comprises a display panel 12 having a display surface 14 that contains a pattern formed by a rectangular planar array of nominally identical data storage or display elements 16 mutually spaced apart by predetermined distances in the vertical and horizontal directions. Each display element 16 in the array represents the overlapping portions of thin, narrow electrodes 18 arranged in vertical columns and elongate, narrow channels 20 arranged in horizontal rows. (The electrodes 18 are hereinafter referred to as "column electrodes 18.") The display elements 16 in each of the rows of channels 20 represent one line of data.

The widths of column electrodes 18 and channels 20 determine the dimensions of display elements 16, which are of rectangular shape. Column electrodes 18 are deposited on a major surface of a first electrically nonconductive, optically transparent substrate, and channels 20 are inscribed in a major surface of a second electrically nonconductive, optically transparent substrate, as will be further described below. Skilled persons will appreciate that certain systems, such as a reflective display of either the direct view or projection type, would require that only one of the substrates be optically transparent.

Column electrodes 18 receive data drive signals of the analog voltage type developed on parallel output conductors 22' by different ones of the output amplifiers 22 (FIGS. 2–6) of a data driver or drive circuit 24, and channels 20 receive data strobe signals of the voltage pulse type developed on parallel output conductors 26' by different ones of the output amplifiers 26 (FIGS. 2–6) of a data strobe or strobe means or strobe circuit 28. Each of the channels 20 includes a reference electrode 30 (FIG. 2) to which a reference potential common to each channel 20 and data strobe 28 is applied.

To synthesize an image on the entire area of display surface 14, display system 10 employs a scan control circuit 32 that coordinates the functions of data driver 24 and data strobe 28 so that all columns of display elements 16 of display panel 12 are addressed row by row in row scan fashion. Display panel 12 may employ electro-optic materials of different types. For example, if it uses such a material that changes the polarization state of incident light rays 33, display panel 12 is positioned between a pair of light polarizing filters 34 and 36 (FIG. 2), which cooperate with display panel 12 to change the luminance of light propagating through them. The use of a scattering liquid crystal cell as the electro-optic material Would not require the use of polarizing filters 34 and 36, however. A color filter (not shown) may be positioned within display panel 12 to develop multi-colored images of controllable color intensity. For a projection display, color can also be achieved by using three separate monochrome panels 10, each of which controls one primary color.

With reference to FIGS. 2–5, display panel 12 comprises an addressing structure that includes a pair of generally parallel electrode structures 40 and 42 spaced apart by a layer 44 of electro-optic material, such as a nematic liquid crystal, and a thin layer 46 of a dielectric material, such as glass, mica, or plastic. Electrode structure 40 comprises a glass dielectric substrate 48 that has deposited on its inner surface 50 column electrodes 18 of indium tin oxide, which is optically transparent, to form a striped pattern. Adjacent pairs of column electrodes 18 are spaced apart a distance 52, which defines the horizontal space between next adjacent display elements 16 in a row.

Figure 3:
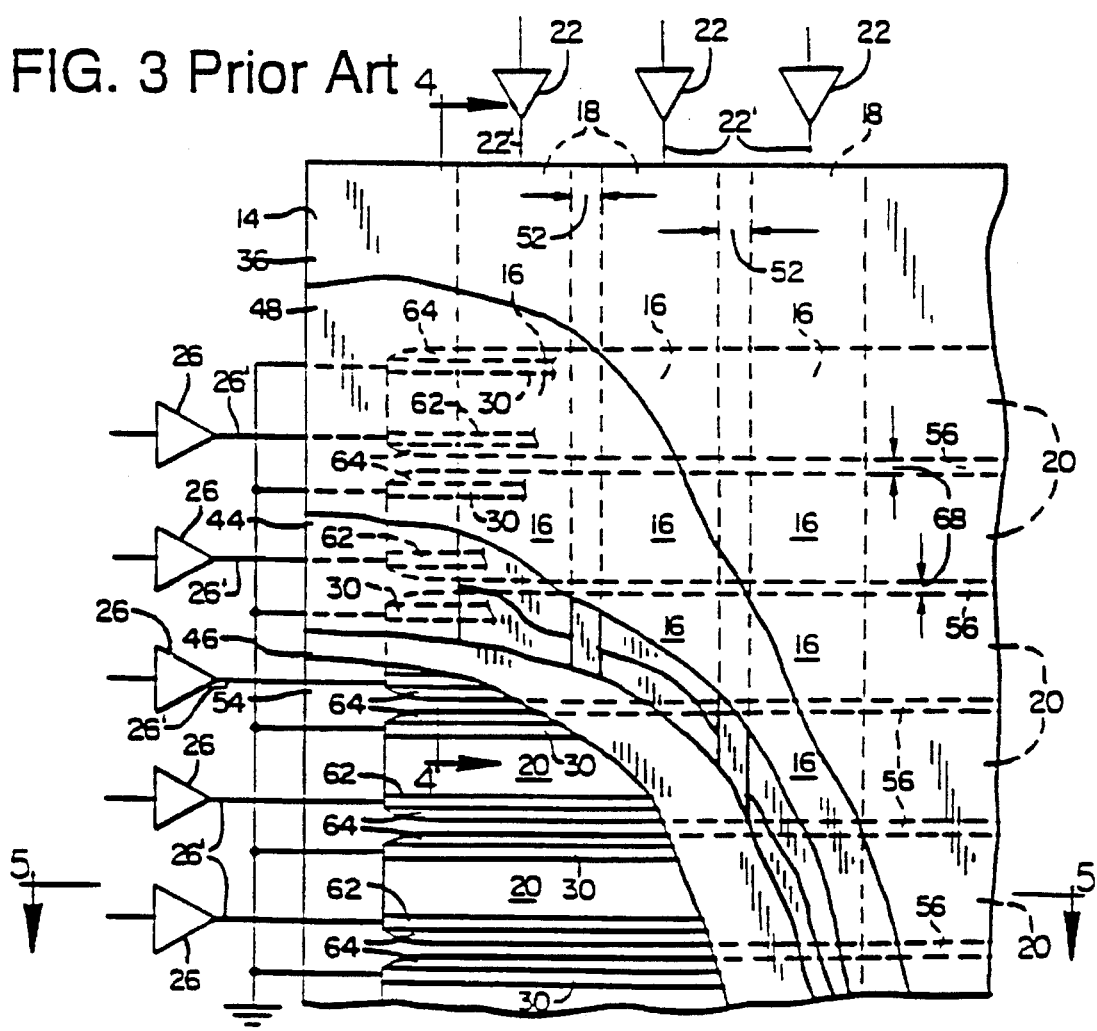
FIG. 3 is an enlarged fragmentary frontal view with portions broken away to show different depthwise views of the interior of the display panel of FIG. 2.
Figure 2:
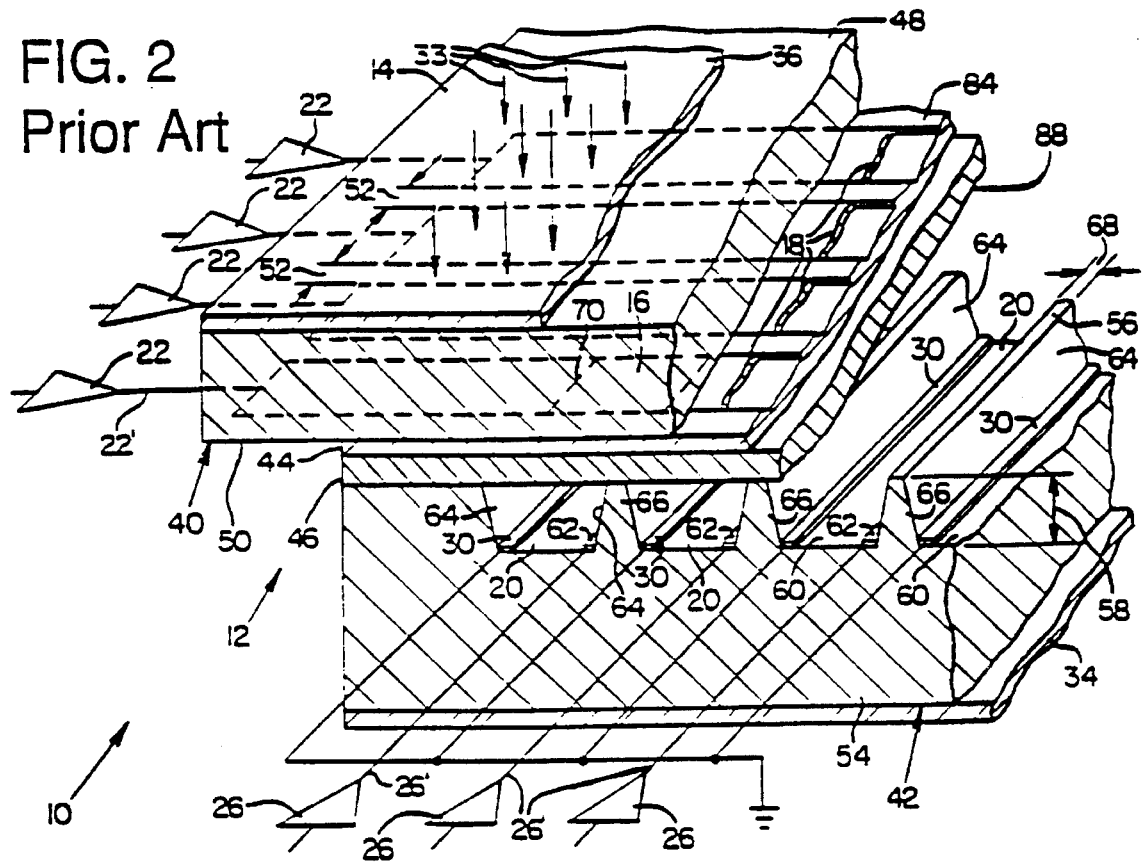
FIG. 2 is an enlarged fragmentary isometric view showing the layers of structural components forming the display panels described in the '149 Patent as viewed form the left side in FIG. 1.

Electrode structure 42 comprises a glass dielectric substrate 54 into whose inner surface 56 multiple channels 20 of trapezoidal cross section are inscribed. Channels 20 have a depth 58 measured from inner surface 56 to a base portion 60. Each one of the channels 20 has a pair of thin, narrow nickel electrodes 30 and 62 extending along base portion 60 and a pair of inner side walls 64 diverging in the direction away from base portion 60 toward inner surface 56. The reference electrodes 30 of the channels 20 are connected to a common electrical reference potential, which can be fixed at ground potential as shown. The electrodes 62 of the channels 20 are connected to different ones of the output amplifiers 26 (of which three and five are shown in FIG. 2 and FIG. 3, respectively) of data strobe 28. (The electrodes 62 are hereinafter referred to as "row electrodes 62.") To ensure proper operation of the addressing structure, the reference electrodes 30 and row electrodes 62 preferably are connected to the electrical reference potentials and the outputs 26' of data strobe 28, respectively, on opposite sides of display panel 10.

The sidewalls 64 between adjacent channels 20 define a plurality of support structures 66 whose top surfaces 56 support layer 46 of dielectric material. Adjacent ones of channels 20 are spaced apart by the width 68 of the top portion of each support structure 66, which width 68 defines the vertical space between next adjacent display elements 16 in a column. The overlapping regions 70 of column electrodes 18 and channels 20 dimensions of display elements 16, which are shown in dashed lines in FIGS. 2 and 3. FIG. 3 shows with better clarity the array of display elements 16 and the vertical and horizontal spacings between them.

The magnitude of the voltage applied to column electrodes 18 specifies the distance 52 to promote isolation of adjacent column electrodes 18. Distance 52 is typically much less than the width of column electrodes 18. The inclinations of the side walls 64 between adjacent channels 20 specify the distance 68, which is typically much less than the width of channels 20. The widths of the column electrodes 18 and the channels 20 are typically the same and are a function of the desired image resolution, which is specified by the display application. It is desirable to make distances 52 and 68 as small as possible. In current models of display panel 12, the channel depth 58 is one-half the channel width.

Each of the channels 20 is filled with an ionizable gas, preferably one that includes helium, for reasons that will be explained below. Layer 46 of dielectric material functions as an isolating barrier between the ionizable gas contained within channel 20 and layer 44 of liquid crystal material. The absence of dielectric layer 46 would permit either the liquid crystal material to flow into the channel 20 or the ionizable gas to contaminate the liquid crystal material, however. Dielectric layer 46 may be eliminated from displays that employ a solid or encapsulated electro-optic material.

Figure 6:
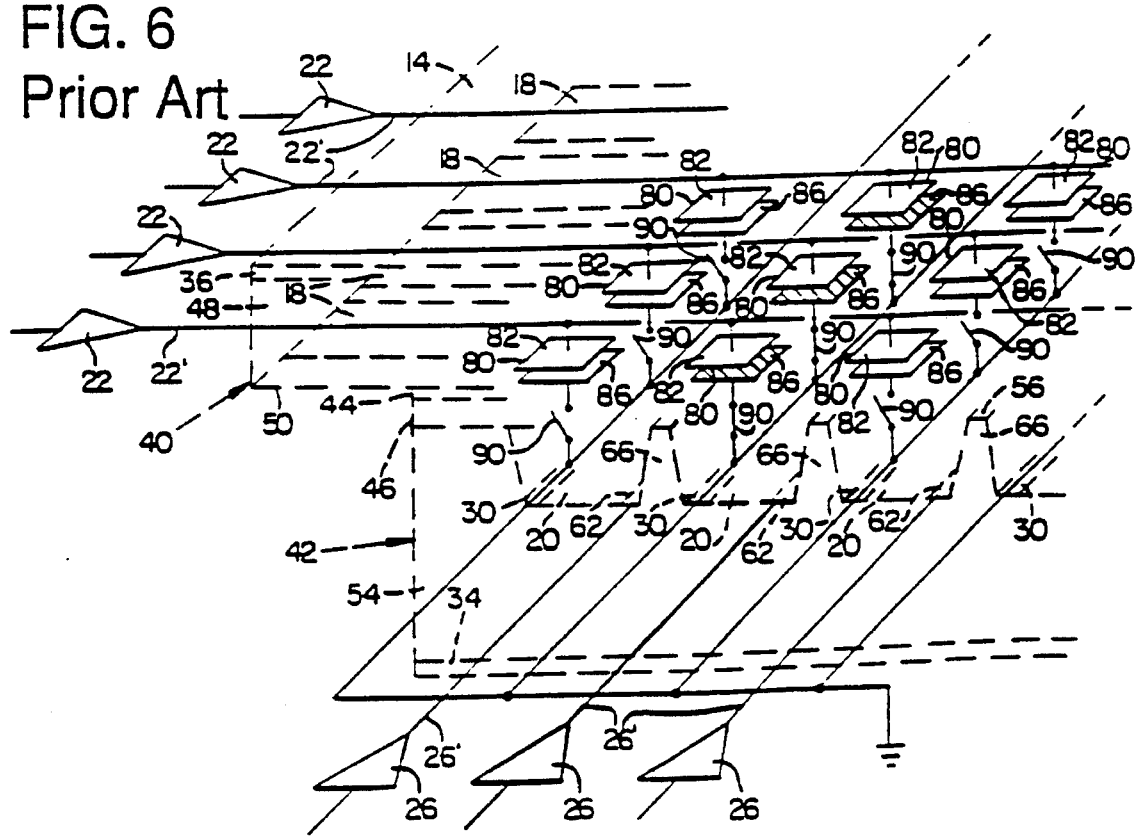
FIG. 6 is an equivalent circuit showing for a display system the operation of the plasma as a switch for an exemplary row receiving a data strobe pulse and three exemplary data columns receiving a data drive signal.

The principles underlying the operation of display panel 12 are that (1) each of its display elements 16 functions as a sampling capacitor for analog voltage data applied to the column electrode 18 forming a part of the display element and (2) the ionizable gas functions as a sampling switch. FIG. 6 is an equivalent circuit to which the following explanation of the operation of display system 10 refers.

With reference to FIG. 6, each of display elements 16 of display panel 12 can be modeled as a capacitor 80 (hereinafter "capacitor model 80"), whose top plate 82 represents one of the column electrodes 18 (FIG. 2) and whose bottom plate 86 represents the free surface 88 (FIG. 2) of layer 46 of the dielectric material. Capacitor model 80 represents the capacitive liquid crystal cell formed by an overlapping region of a column electrode 18 and a channel 20. The description herein of the operation of display system 10 refers to the capacitor model 80.

In accordance with the basic addressing procedure, data driver 24 captures a first line of data, which represents discrete samples of the time-varying voltage of analog data signal in a time interval of predetermined duration. The sample of the magnitude of the data signal at a particular instance within the time interval represents the magnitude of the analog voltage applied to a capacitor model 80 in a corresponding column position of the row electrode 62 receiving a strobe pulse. Data driver 24 develops on its output conductors 22 the analog voltages that are applied to column electrodes 18. In FIG. 6, four exemplary output amplifiers 22 of data driver 24 deliver analog voltages of positive polarity with respect to reference electrode 30 to the respective ones of column electrodes 18 to which they are connected. The application of a positive voltage on a column electrode 18 induces on free surface 88 (FIG. 2) of layer 46 of the dielectric material a voltage that is essentially equal to the magnitude of the applied voltage. This causes no change in the potential difference across capacitor model 80 and is represented in FIG. 6 by a top plate 82 and a bottom plate 86 with white surfaces.

In this instance, the gas contained in a channel 20 is in a nonionized state, and the analog voltage developed on plates 82 and 86 of capacitor model 80 is positive with respect to the voltage potential of reference electrode 30 in the channel. Whenever data strobe 28 develops a negative-going voltage pulse on the row electrode 62 positioned within a channel 20, the gas in the channel assumes an ionized state (i.e., becomes a plasma). The channel 20 whose row electrode receives the strobe pulse is represented in FIG. 6 in dark, thick lines. Under these conditions, the grounded reference electrode 30 and the strobed row electrode 62 function as an anode and a cathode, respectively, for the plasma contained within the channel.

The electrons in the plasma neutralize the induced positive voltage on the bottom plates 86 of capacitor models 80. The capacitor models 80 in the strobed row are charged with the data voltages applied across them. This condition is indicated in FIG. 6 by top plates 82 with white surfaces and bottom plates 86 with lined surfaces. Upon completion of the storage of the data voltages across capacitor models 80, data strobe 28 terminates the negative-going voltage pulse on the row electrode 62 of the strobed channel 20, thereby ending the strobe pulse and extinguishing the plasma.

Each of the row electrodes 62 is strobed in a similar manner until the entire display surface 14 is completely addressed and thereby stores an image field of data. The voltage remains stored across each of the capacitor models 80 in the strobed row for a time at least as long as the duration of the image field and is independent of subsequent changes in data voltage applied to top plate 82 capacitor model 80. The voltage stored across each of the capacitor models 80 changes in accordance with the analog data voltages representing the display data of the next succeeding image field.

In a display system 10 whose image fields are in a noninterlaced format, the analog data voltages applied to column electrodes 18 in the next succeeding image field are of opposite polarity. Alternating between positive and negative polarities from one image field to the next image field provides a long term zero net DC voltage component, which is typically required for long term operation of liquid crystal materials. The liquid crystal material produces the gray scale effect in response to the root-mean-square (rms) value of the applied analog voltage data. The display image produced is, therefore, unaffected by alternate changes in polarity of the analog voltage data.

In a display system 10 whose image fields are in an interlaced format, the analog data voltages applied to column electrodes 18 in next succeeding image frames are of opposite polarity to achieve the long term zero net DC voltage component. Each image frame includes two image fields of which each comprises one-half the number of addressable lines.

The description presented above indicates that the ionizable gas contained within each of the channels 20 operates as an electrical switch 90 whose contact position changes between binary switching states as a function of the voltage applied by data strobe 28. The switches 90 shown in FIG. 6 in the open position are connected to reference electrodes 30 and are driven by a strobe pulse applied to row electrodes 62. The absence of a strobe pulse allows the gas within the channels 20 to be in a nonionized state and thereby be in a nonconducting state. The switches 90 shown in FIG. 6 in the closed position are connected to a reference electrode 30 and are driven by a strobe pulse that is applied to row electrode 64 and is of a magnitude that causes the gas within the channel 20 to be in an ionized state and thereby be in a conducting state. In FIG. 6, the amplifier 26 shown in the middle of the three output amplifiers 26 of data strobe 28 strobes a row of capacitor models 80 to establish and store the display data voltages across them.

To function as a switch, the ionizable gas contained within channels 20 beneath electrode structure 40 communicates with layer 46 of the dielectric material to provide an electrically conductive path from layer 46 of the dielectric material to reference electrode 30. The plasma in a channel 20 whose row electrode 62 receives a strobe pulse provides a ground path to the capacitor model 80 representing the portion of liquid crystal material positioned adjacent the plasma. This allows the capacitor models 80 to sample the analog data voltages applied to column electrodes 18. Extinguishing the plasma acts to remove the conducting path, thereby allowing the data sample to be held across the display element. The voltages remain stored across layer 44 of the liquid crystal material until voltages representing a new line of data in a subsequent image field are developed across the layer 44. The above-described addressing structure and technique provide signals of essentially 100% duty cycle to every one of the display elements 16.

Electrode structure 42 has limitations imposed by manufacturing and operational considerations. Its row electrodes 30 and reference electrodes 62 must not have defects which interfere with their electrical conductivity. For electrode structure 42, the number of display elements per unit area determines the resolution (in the case of a plasma addressed liquid crystal display system or a video camera) and the number of memory sites per unit area determines the memory density (in the case of a storage system). A greater resolution or memory density, which is desirable for many applications, calls for channels 20 to be narrower and spaced closer together. A narrower channel 20 has a narrower base portion 60. The width of base portion 60 limits the width of row electrodes 30 and of reference electrodes 62. When electrodes 30 and/or 62 are thinner, manufacturing defects are more likely to interfere with adequate electrical conductivity.

As potential applications of the devices disclosed in the '149 Patent demand higher resolution or data density, the problems described above will further constrain the economical manufacture of electrode structures. This constraint may be particularly acute in high-resolution color displays.

FIG. 7 is a fragmentary cross-sectional view of a first embodiment 100 of an improved electrode structure for use in systems such as those disclosed in the '149 Patent. As shown in FIG. 7, electrode structure 100 has a dielectric substrate 102, such as glass. Nonintersecting electrodes 104, 106, 108, 110, and 112 are formed of electrically conductive material on a major surface 114 of substrate 102. Each electrode 104, 106, 108, 110, and 112 has width d and extends along major surface 114 in the same way as shown in FIGS. 2 and 3 for reference electrodes 30 and row electrodes 62.

Electrically insulating, nonintersecting walls 116, 118, 120, 122, and 124 of nominally equal heights are positioned medially and extend along the lengths of the substrate noncontacting surfaces of the respective electrodes 104, 106, 108, 110, and 112. The tops of walls 116, 118, 120, 122, and 124 support a dielectric layer or cover 126, which is preferably a thin sheet of glass, plastic, or mica.

Walls 116, 118, 120, 122, and 124, together with their associated respective electrodes 104, 106, 108, 110, and 112, form the respective channel-defining portions 128, 130, 132, 134, and 136 for electrode structure 100. Each electrode 104, 106, 108, 110, and 112 is contained in only one channel-defining portion, i.e., the respective one of channel-defining portions 128, 130, 132, 134, and 136. Adjacent channel-defining portions, together with cover 126 and major surface 114 of substrate 102, form the channels that contain the ionizable gaseous medium. In particular, the pairs of channel-defining portions 128 and 130, 130 and 132, 132 and 134, and 134 and 136 define the respective four complete channels 129, 131, 133, and 135 depicted in FIG. 7. Of course, electrode structure 100 has many other channels, as indicated by fragmented channels 127 and 137, which are defined in part by the respective channel-defining portions 128 and 136. Each electrode 104, 106, 108, 110, and 112 thus has a surface in each of two adjacent channels.

Electrode structure 100 can be manufactured by a variety of processes well known to skilled persons. As examples, electrode structure 100 can be formed by silkscreening, or by evaporating or patterning with subsequent photopatterning.

FIG. 7 also shows three mutually perpendicular X, Y, and Z axes. The X axis is parallel to the plane of major surface 114 of substrate 102; the Y axis is perpendicular to that plane; and the Z axis is perpendicular to the plane of FIG. 7. Electrode structure 100 extends along the X axis to the left and to the right of the part shown in FIG. 7 and into and out of the plane of FIG. 7 along the Z axis.

Each channel has a width x measured along the X axis and a height y measured along the Y axis. The width d of the electrodes (such as electrode 104) is substantially greater than the width of the walls (such as wall 116). Thus, each electrode extends into each channel a substantial fraction of channel width x.

An advantage of electrode structure 100 is that the minimum electrode feature size is the width d of each of the electrodes. A higher manufacturing yield of acceptable electrode structures 100 is obtained with a larger minimum electrode feature size because a larger minimum electrode feature size reduces the effect of patterning defects, of dust particles, and of ordinary variations in manufacturing by allowing the electrode to retain conductance along its length more often than if the minimum electrode feature size were smaller. By comparing FIG. 7 with FIGS. 2 and 3, it will be seen that, for channels of a given width x, the minimum electrode feature size of electrode structure 42 of FIGS. 2 and 3 (which is the smaller of the respective widths of the reference electrodes 30 or of the row electrodes 62 shown in FIGS. 2 and 3) is considerably smaller than the minimum electrode feature size d of electrode structure 100 of FIG. 7.

Further advantages of electrode structure 100 flow from its electrical configuration and operation. For a given channel width x, the width d of the electrodes of FIG. 7 is larger than the respective widths of the reference electrodes 30 or the row electrodes 62 of FIGS. 2 and 3. Thus, the voltage drop along an electrode such as electrodes 104, 106, 108, 110, and 112 of FIG. 7 will be less than the voltage drop along the reference electrodes 30 or the row electrodes 62 of FIGS. 2 and 3. This lesser voltage drop allows the manufacture of longer channels, because the necessarily longer electrodes can achieve and maintain ionization of the gas in the middle of those longer channels.

In addition, electrode structure 100 has only half as many electrodes as electrode structure 42 of FIGS. 2 and 3. Electrode structure 100 is typically formed on a substrate (such as substrate 102) on which are formed electrical contacts (not shown) leading to the electrodes (such as electrodes 104, 106, 108, 110, and 112). Electrical connections are made at those contacts between the electrodes and electronic circuitry (not shown) that drives the electrodes. That electronic circuitry is typically external to the substrate. Because electrode structure 100 requires only half as many electrodes as electrode structure 42 of FIGS. 2 and 3, electrode structure 100 requires only half as many electrical contacts. Thus, with electrode structure 100 each electrical contact can be made with a larger surface area than would be possible with electrode structure 42 of FIGS. 2 and 3. This not only increases manufacturing yield of electrode structure 100 (for the reasons discussed above) but also increases reliability of the connections between each electrical contact and the external electronic circuitry.

Substrate 102 may also be of material which allows some electronic circuitry associated with the electrodes to be manufactured on or in substrate 102. As an example, if substrate 102 is silicon, some electronic circuitry may be formed of polysilicon.

Electrode structure 100 is used in a display or memory system, such as that disclosed in the '149 Patent, as the lower electrode of that system. The channels of electrode structure 100 (such as channels 127, 129, 131, 133, 135, and 137) are filled with an ionizable gas, and the display or memory system operates, as disclosed in the '149 Patent, by (among other steps) selectively causing the gas within a particular channel (such as channel 129) to become ionized.

However, electrode structure 100 of FIG. 7 differs in electrical configuration and operation from electrode structure 42 of FIGS. 2 and 3.

In electrode structure 100 the gas contained in a particular channel (such as channel 129) becomes ionized on firing of adjacent pairs of electrodes (such as electrodes 104 and 106) in the channel-defining portions (such as channel-defining portions 128 and 130) which define that channel. Each electrode (such as electrode 104) extends into each of two adjacent channels (such as, in the case of electrode 104, channels 127 and 129). Thus, when two adjacent electrodes of the electrode structure 100 are activated to fire the ionizable gas in the channel (such as channel 129) between them, it is possible that the ionizable gas in the other two channels (such as channels 127 and 131) into which one of the two firing electrodes extends might also become ionized. As an example, an electrode driven as a cathode could ionize the ionizable gaseous medium in each of the channels to which that electrode is exposed if the electrode on the other side of each such channel is referenced to ground. Such a result corresponds to an unwanted closing of a switch 90 in the capacitor model of FIG. 6. To ensure the proper operation of the display or memory system, it is important to ensure that unwanted ionized conditions are not created in the gas contained in the channels.

To prevent such unwanted firing of the gas contained in an unselected channel in electrode structure 100, there are three conditions that should be met.

First, the gas in any channel can be ionized only at the proper moment in the scanning sequence. This condition pertains to preventing not only a misfiring of gas in an unselected channel by the presence of improper voltages on the channel electrodes but also a spurious misfiring of stored charge in an unselected channel.

Second, the duty cycles for the electrode drive signals applied to each channel electrode should be small and substantially constant as respects all of the electrodes driven, and the electrode drive signals should preferably return to a ground potential upon completion of the ionization of gas in a channel. The reason for a small, substantially constant duty cycle is that the drive signal voltages applied to the channel electrodes are capacitively coupled to the liquid crystal material affecting the voltage stored across it; therefore, drive signals with a longer duty cycle have a greater effect as a form of crosstalk on the stored voltage. The return to ground potential is preferable because superimposing or "floating" the data drive voltages on a nonground potential would otherwise be necessary to minimize crosstalk.

Third, the channel electrode drive signal voltages are preferably the same as or lower than those used to drive electrode structures in a unichannel configuration, such as that of electrode structure 42 shown in FIGS. 2 and 3. This condition constrains the voltages to those of currently available drive circuits.

Figure 8B:
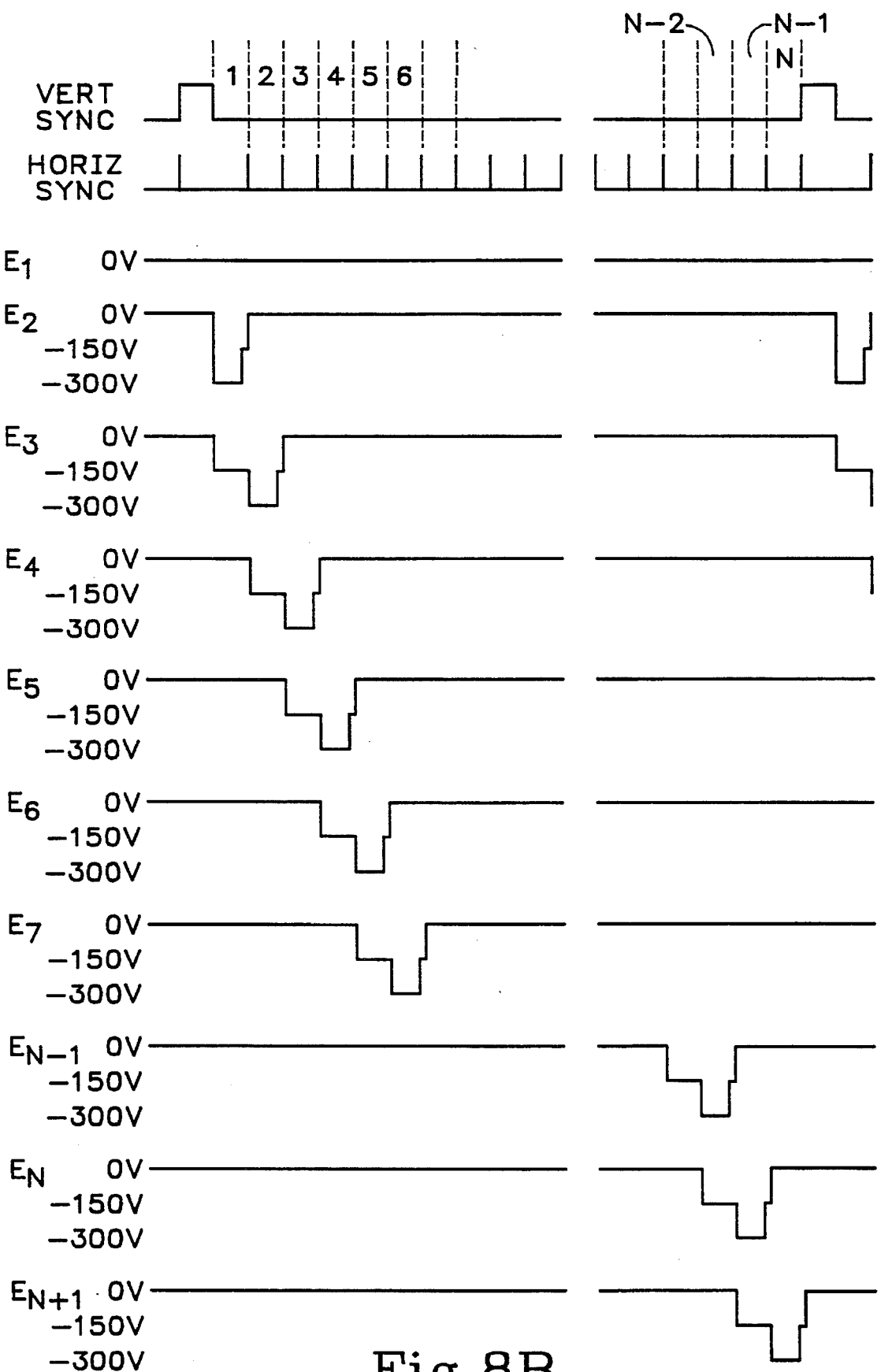
FIG. 8B is a timing diagram showing the sequence of the drive signals that accomplish a row scan operation of the improved electrode structure according to the invention.

FIG. 8A is a diagram showing channel electrode output amplifiers that deliver drive signals to the common channel electrodes of FIG. 7. FIG. 8B is a timing diagram that shows the timing and voltage level relationships among the drive signals as the gas contained in the channels is selectively ionized in succession to accomplish a row scan operation of electrode structure 100. For purposes of clarity, output amplifiers $E_3$, $E_4$, $E_5$, $E_6$, and $E_7$ have been designated as driving the respective common channel electrodes 104, 106, 108, 110, and 112 to indicate that channels 129, 131, 133, and 135 represent a nonspecific four-channel portion of electrode structure 100.

With reference to FIGS. 8A and 8B, the channel electrodes are driven in the following manner. In general, each of the drivers delivers a drive signal voltage pulse in consecutive order to an electrode that is common to two adjacent channels. A vertical sync pulse starts a frame scan or selection operation of N number of channels, and a different one of N number of horizontal sync pulses ends the selection of each channel.

During the beginning of the selection of channel 129, the potential difference between the $E_3$ and $E_4$ signals applied to the respective electrodes 104 and 106 is 300 volts, which is sufficient to cause ionization of gas between electrodes 104 and 106 in channel 129. The potential difference is 150 volts between the $E_4$ and $E_5$ signals applied to the respective electrodes 106 and 108 and between the $E_5$ and $E_6$ signals applied to the respective electrodes 108 and 110, which potential difference is insufficient to either sustain or initiate ionization of gas in channels 131 and 133. Output amplifier $E_4$ imparts to the next to be selected channel (channel 131) a midpoint potential difference of 150 volts and acts as a buffer for the next to be selected channel from the full 300 volt potential difference. Near the conclusion of the selection of channel 129, the $E_4$ signal applied to electrode 106 increases to a –150 volt level, which shortens the ionization decay time.

During the beginning of the selection of channel 131, the $E_4$ signal applied to electrode 106 increases to ground potential and the $E_5$ signal applied to electrode 108 decreases to –300 volts, thereby developing a potential difference of 300 volts between electrodes 106 and 108 in channel 131 to ionize the gas contained in it. The $E_6$ drive signal applied to electrode 110 drops at this time to –150 volts to buffer the next to be selected channel (channel 133) from firing. The signals applied to the selected channel return to ground potential upon selection of the next to be selected channel and thus helps prevent the misfiring of any charge stored in the just previously selected channel.

FIG. 8B indicates that this process continues for each successive channel until N number of them have been selected. The process restarts upon receipt of another vertical sync pulse. FIG. 8B also shows that the $E_1$ and $E_2$ drive signals applied to the first two electrodes driven after the start of a scan operation differ from those sequentially applied to the remaining electrodes. The reason is that these electrodes are common to the first channel to be selected, which thus does not follow a previously fired adjacent channel.

FIGS. 9–15 depict respective alternative embodiments 100A–100G of an electrode structure according to the invention. The views of FIGS. 9–15 are the same as the view of FIG. 7, but the X, Y, and Z, axes have been omitted only for purposes of clarity. In FIGS. 9–15, components corresponding to those in FIG. 7 bear identical reference numerals followed by a letter suffix A–G for FIGS. 9–15, respectively. Alternative embodiments 100A–100G of FIGS. 9–15, respectively, may also be electrically configured and driven as described above.

With reference to FIG. 7, in electrode structure 100 some or all of the electrodes can be formed of a material which is transparent. Forming the electrodes from such a material can improve the performance of a display system because the amount of light which can pass through the display system is thereby increased. This can improve the contrast between "light" and "dark" areas of the display. As an example, if electrode structure 100 is to be used in a display intended to operate with visible light, some or all of the electrodes 104, 106, 108, 110, and 112 may be formed of indium tin oxide.

In an electrode structure it is desirable to form an electrode which acts as a cathode of metal to provide greater resistance against erosion of that electrode. Metals are normally not transparent. When the electrode structure 100 depicted in FIG. 7 is electrically configured and driven in the first DC configuration (that is, with every other electrode electrically configured as a cathode), the electrodes configured as anodes can be formed of a transparent material (as an example, indium tin oxide) when the electrodes configured as cathodes are formed of metal. The transparency of the anodes counteracts to some extent the reduced light transmission due to every alternate electrode being formed of nontransparent metal.

Transparent materials such as indium tin oxide often are not as conductive as metals. If some or all of the electrodes shown in FIG. 7 were formed of a transparent material such as indium tin oxide, such electrodes might not have enough conductivity to initiate or maintain ionization throughout the length of a channel.

Figure 9:
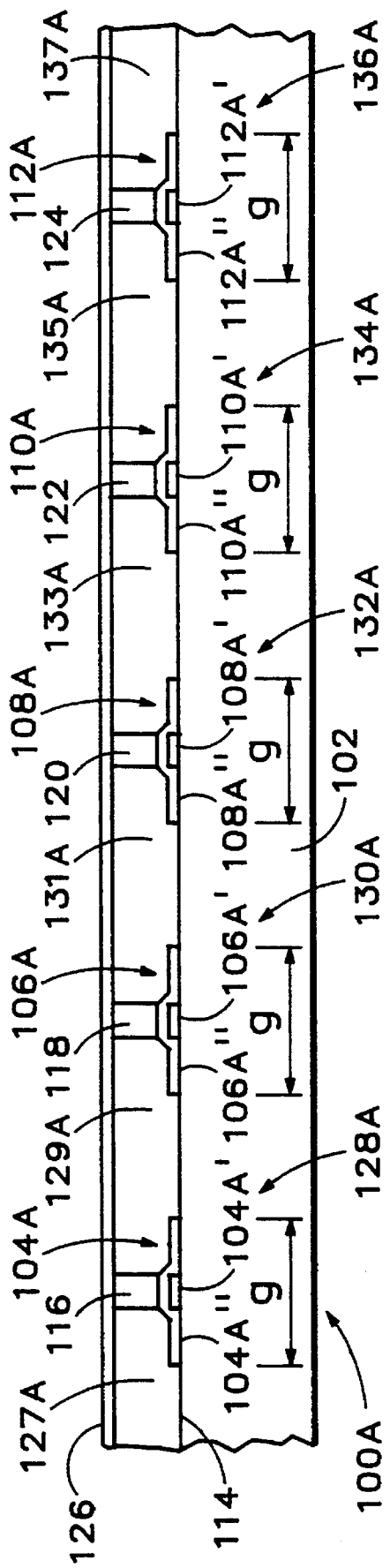

FIG. 9 depicts a second embodiment 100A of an electrode structure according to the invention which alleviates the problem just described. In FIG. 8 each electrode 104A, 106A, 108A, 110A, and 112A comprises an electrically conductive (preferably metallic) current bus 104A', 106A', 108A', 110A', and 112A'. Each current bus 104A', 106A', 108A', 110A', and 112A' is electrically coupled with an associated electrically conductive (preferably transparent) distribution bus 104A", 106A", 108A", 110A", and 112A", respectively. Each current bus 104A', 106A', 108A', 110A', and 112A', together with its respective distribution bus 104A", 106A", 108A", 110A", and 112A", and together with its respective walls 116, 118, 120, 122, and 124, constitutes channel-defining portion 104A, 106A, 108A, 110A, and 112A, respectively. The width g of the distribution buses is selected to allow the distribution buses to initiate and maintain ionization in the middle of the channels which they in part define.

FIG. 9 shows each current bus 104A', 106A', 108A', 110A', and 112A' in contact with substrate 102. FIG. 9 also shows each distribution bus 104A", 106A", 108A", 110A", and 112A" in contact with an associated walls 116, 118, 120, 122, and 124, respectively. As additional examples, (1) each current bus could be in contact with its respective wall, and each distribution bus could be in contact with surface 114, or (2) the layer of distribution bus 104A", 106A", 108A", 110A", and 112A" which lies between each respective wall 116, 118, 120, 122, and 124, and each respective current bus 104A', 106A', 108A', 110A', and 112A', could be omitted.

In the structure of FIG. 9 each current bus portion is structured and dimensioned, and formed of a suitable material, so that it (together with its associated distribution bus) is effective to carry a current sufficient to initiate and to maintain ionization throughout the length of the channels. Because each current bus is beneath its respective wall, the current buses do not adversely affect transmission of light through electrode structure 100A.

Figure 10:
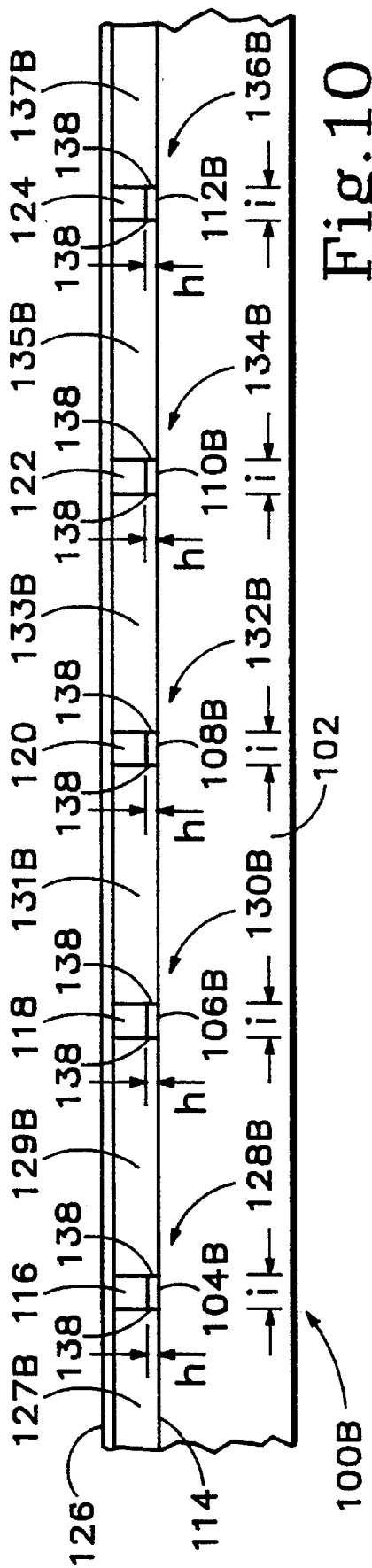

FIG. 10 depicts a third embodiment 100B of an electrode structure according to the invention. In FIG. 10 substrate 102 supports electrically conductive electrodes 104B, 106B, 108B, 110B, and 112B. Above those electrodes are respective electrically non-conductive walls 116, 118, 120, 122, and 124. Each electrode and its respective wall together define a respective one of the channel-defining portions 128B, 130B, 132B, 134B, and 136B. Above the walls is cover 126. Substrate 102, the channel-defining portions, and cover 126 define channels 127B, 129B, 131B, 133B, 135B, and 137B, which in operation are filled with an ionizable gas. Each electrode is exposed by a surface 138 to each of the two channels which that electrode partially defines. Each surface 138 has a height h above major surface 114; each electrode has a width i.

As shown in FIG. 10, each electrode lies substantially directly below, and thus does not extend substantially beyond, its associated wall. The height h and width i of an electrode in electrode structure 100B must be large enough to permit an adequate current to flow to or from each side 138 of the electrode to initiate and to maintain ionization in the middle of each of the channels defined in part by the electrode. An electrode shown in FIG. 10 may, if desired, extend out from under its respective wall; the width i of such an electrode need not be the same as the width d of electrode structure 100 of FIG. 7 or of the width g of electrode structure 100A of FIG. 9.

Electrode structure 100B has the advantage that each of its electrodes lies underneath its respective wall. With such a structure the electrodes (even if they are formed of a nontransparent material such as metal) do not substantially affect the light transmission characteristics of electrode structure 100C. Even if the electrodes are nontransparent, they will not substantially affect the light transmission characteristics of electrode structure 100B if they extend only a small distance out from under their respective walls.

Electrode structure 100A may be manufactured by the same processes described in connection with FIG. 7.

FIG. 11 depicts a third embodiment 100C of an electrode structure according to the invention. In FIG. 11 substrate 102 supports electrically conductive electrodes 104C, 106C, 108C, 110C, and 112C. Each electrode has a top surface 142 and side surfaces 144. Above those electrodes are electrically non-conductive walls 116C, 118C, 120C, 122C, and 124C, respectively, which comprise a fiber. As examples, the fiber comprised in walls 116C, 118C, 120C, 122C, and 124C may be a glass fiber or an optical fiber. Each electrode 104C, 106C, 108C, 110C, and 112C and its respective wall 116C, 118C, 120C, 122C, and 124C comprise one of the channel-defining portions 128C, 130C, 132C, 134C, and 136C, respectively. Above the channel-defining portions is cover 126. Substrate 102, channel-defining portions 128C, 130C, 132C, 134C, and 136C, and cover 126 define channels 127C, 129C, 131C, 133C, 135C, and 137C.

In FIG. 11 the electrodes such as electrode 104C have a height j and a width k. The walls such as wall 116C do not cover the entire top surface 142 of electrode 104C; thus, in electrode structure 100C the electrodes have additional surface exposed to each channel to carry current associated with a plasma discharge. As in FIG. 10, the height j and width k are selected to be large enough to permit an adequate current to flow to or from the sides 144 and the exposed top 142 of each electrode to initiate and to maintain ionization in the middle of each of the channels defined in part by that electrode.

The electrode structure 100C of FIG. 11 may be formed by placing fibers such as wall 116C on electrodes such as electrode 104C. The electrodes, such as electrode 104C of FIG. 11 are formed by processes such as those described in connection with FIG. 7.

The electrodes, such as electrode 104C, of FIG. 11 may be formed of a substance effective to bind to walls such as wall 116C and to major surface 114 of substrate 102. Substrate 102 may be formed of glass. If the walls such as wall 116C are formed of glass fiber, their respective electrodes such as electrode 104C may be formed of nickel paste frits. After the walls such as wall 116C are placed on their respective electrodes such as electrode 104C, an assembly including substrate 102, the electrodes such as electrode 104C, and the walls such as wall 116C is heated to fuse the nickel paste frits together. Fused nickel paste frits are electrically conductive and bind to glass surfaces. In this way the electrodes such as electrode 104C can also act as adhesives to hold the walls such as wall 116C in a unitary structure with the substrate 102.

FIG. 12 depicts a partial cross-section of a fifth embodiment 100D of an electrode structure according to the invention. In FIG. 12 substrate 102 supports electrically conductive electrodes 104D, 106D, 108D, 110D, and 112D. Each electrode has a surface 146 exposed to each of the two channels the electrode in part defines. Each electrode 104D, 106D, 108D, 110D, and 112D is in contact with an electrically non-conductive wall 116D, 118D, 120D, 122D, and 124D, respectively. Each wall includes a fiber. As examples, the fiber included in walls 116D, 118D, 120D, 122D, and 124D may be a glass fiber and/or an optical fiber. Each electrode 104D, 106D, 108D, 110D, and 112D and its respective wall comprise one of the channel-defining portions 128D, 130D, 132D, 134D, and 136D. Above those channel-defining portions is cover 126. Substrate 102, channel-defining portions 128D, 130D, 132D, 134D, and 136D, and cover 126 define channels 127D, 129D, 131D, 133D, 135D, and 137D.

Electrode structure 100D of FIG. 12 is formed by depositing on each wall a layer of material which is to act as the electrode with which that wall is associated. Each wall with its attached layer of electrode material is then placed on and attached to substrate 102.

For each wall (such as wall 116D) and its electrode (such as electrode 104D), the diameter m of the wall and the thickness l of the electrode on the wall are chosen so that, after the wall with its attached electrode is attached to substrate 102, the electrode has enough exposed surface 146 to allow the formation and maintenance of ionization in each channel which is defined in part by the electrode and a sufficient thickness l to ensure an adequate service life.

Figure 13:
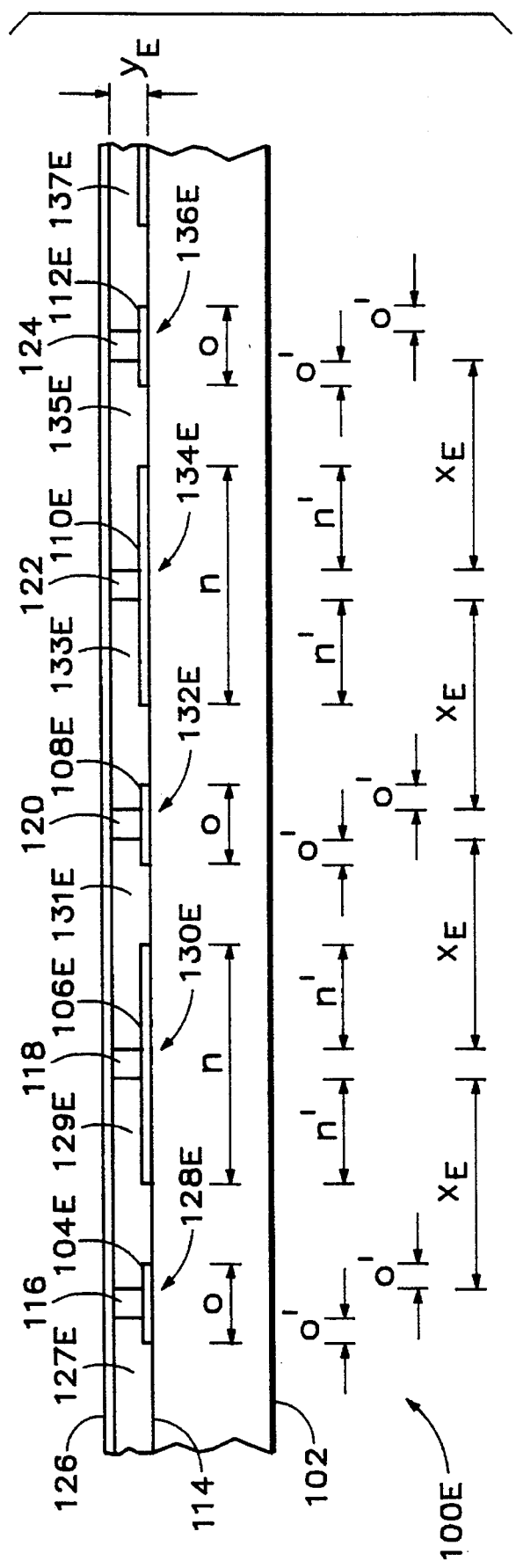

FIG. 13 depicts a partial cross-section of a sixth embodiment 100E of an electrode structure according to the invention. Electrode structure 100E of FIG. 13 is substantially the same as the electrode structure 100 of FIG. 7, except that in FIG. 13 the width n of wider electrodes 106E and 110E is greater than the width o of narrower electrodes 104E, 108E, and 112E.

In addition, in electrode structure 100E of FIG. 12 each wider electrode 106E and 110E extends a distance n' into the channel on each side of the respective wall associated with such electrode, and each narrower electrode 104E, 108E, and 112E extends a distance o' into the channel on each side of each electrode. The combined width n'+o' of those electrodes is a substantial fraction of the width $X_E$ of each channel 127E, 129E, 131E, 133E, and 135E. Each such channel has a height $Y_E$ above major surface 114 of substrate 102.

In electrode structure 100E of FIG. 13 the wider electrodes (such as electrodes 106E and 110E) are preferably formed of a transparent material. As an example, if electrode structure 100E is to operate with visible light, wider electrodes 106E and 110E may be formed of indium tin oxide.

Narrower electrodes 128E, 132E, and 136E may be formed of a nontransparent material (such as a metal). Electrode structure 100E thus has the advantage of having a substantial portion (of width $X_E$–o') of the width $X_E$ of a channel substantially transparent to light. As described above, this increases the contrast when electrode structure 100E is used in a display device.

Materials (such as indium tin oxide) which are substantially transparent to light are typically not as good a conductor as a metal (which is typically not transparent). Thus, wider electrodes 106E and 110E are best electrically configured as anodes. The width n' of the wider electrodes which is exposed in each channel provides a larger exposed surface area, which tends to improve the performance of the wider electrodes.

Figure 14:
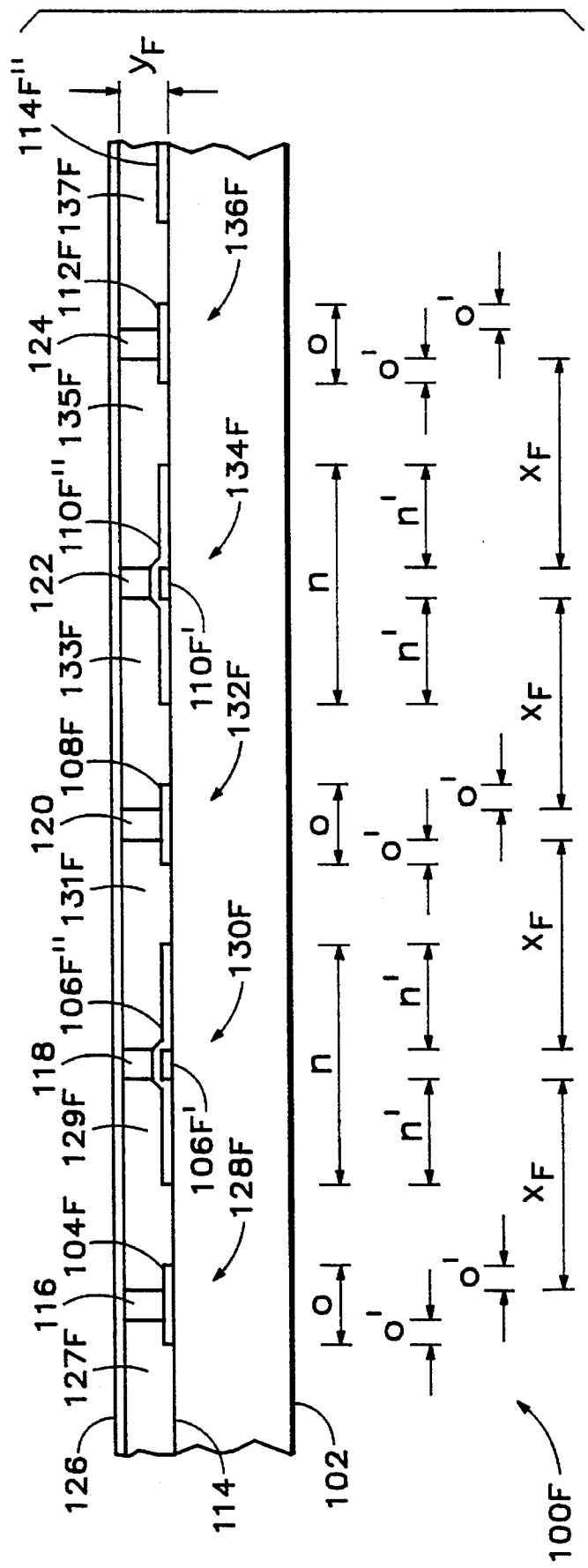

FIG. 14 depicts a partial cross-section of a seventh embodiment 100F of an electrode structure according to the invention. FIG. 14 is essentially the same as FIG. 13. However, in FIG. 14 electrically conductive current buses 106'F and 110'F and electrically conductive distribution buses 106"F and 110"F replace electrodes 106E and 110E of FIG. 12. Electrode structure 100F of FIG. 14 has the same advantage over electrode structure 100E of FIG. 13 as electrode structure 100A of FIG. 9 has over electrode structure 110 of FIG. 7.

In addition, a U.S. Patent Application of Paul C. Martin and Thomas S. Buzak for an "Anode and Cathode Arrangement for Plasma Addressing Structure," Ser. No. 08/285, 586, Continuation of Ser. No. 07/936,194, now abandoned, filed concurrently with the present patent application, discloses another way in which the electrode structures 100E of FIG. 13 and 100F of FIG. 14 provide beneficial results. With specific reference to FIG. 11, the greater distance n' which wider electrodes 106E and 110E extend into the channels which those electrodes in part define permits the ratio of the height $Y_E$ of the channels to the width $X_E$ to be reduced in comparison with height of the electrode structure disclosed in the '149 Patent. As described in greater detail in that application, a variety of beneficial results flow from that reduction. Those beneficial results are also achieved with electrode structures (such as the electrode structures 100E of FIG. 12 and 100F of FIG. 14) of the present invention. Skilled persons will appreciate that those advantageous can also be secured with electrode structures 100, 100A, 100C, 100D, and 100F of FIGS. 7, 9, 11, 12, and 14, respectively.

FIG. 15 depicts a partial cross-section of an eighth embodiment 100G of an electrode structure according to the invention. In FIG. 15 electrode structure 100G is preferably formed from a layered blank through a subtractive process. The layered blank has substrate 102, a substantially planar layer of conductive material in contact with substrate 102, and a layer of insulating material in contact with the layer of conductive material. A subtractive process (preferably etching) removes portions of the layer of insulating material, the layer of conductive material, and part of substrate 102. Electrode structure 100G results.

Electrode structure 100G has channel-defining portions 128G, 130G, 132G, 134G, and 136G left between the regions where the subtractive process has removed material to create channels 127G, 129G, 131G, 133G, 135G, and 137G. The channel-defining portions are nonintersecting.

Each channel-defining portion contains a remnant of the substantially planar layer of conductive material. That remnant constitutes electrode 104G, 106G, 108G, 110G, and 112G for channel-defining portions 128G, 130G, 132G, 134G, and 136G, respectively. Each electrode has one surface exposed on one side of its channel-defining portion and one surface exposed on the other side of its channel-defining portion. Thus, each electrode has a surface exposed to each of two adjacent channels.

Each channel-defining portion also contains a remnant of the layer of insulating material in contact with the layer of conductive material. That remnant forms wall 116G, 118G, 120G, 122G, and 124G of channel-defining portions 128G, 130G, 132G, 134G, and 136G, respectively. Each wall separates its respective electrode from cover 126.

Skilled persons will appreciate that the optimum operating parameters of devices which employ electrode structures according to the invention, such as electrode structures 100–100G of FIGS. 7 and 9–15, respectively, will vary depending on the materials of the electrodes and the geometry of the channels. Such operating parameters include the ionizable gas used to fill the channels, the pressure at which that gas is maintained, and the voltages and currents used to initiate and to maintain ionization in the channels. Skilled persons can readily determine optimum operating parameters.

As an example, the first embodiment 100 (FIG. 7) of an electrode structure according to the invention has as its ionizable gaseous medium helium at a pressure of 150 mbar. The channels are approximately 34.3 cm long when measured along the Z axis and have a pitch (the spacing measured along the X axis between corresponding points on a channel) of approximately 0.5 mm. The width x of each channel is approximately 0.43 mm. Each channel extends approximately 0.15 mm parallel to the Y axis between substrate 102 and cover 126. The electrodes are formed of aluminum; the distance d is approximately 0.18 mm, and the electrodes are approximately 2 microns thick measured in a direction parallel to the Y axis. The maximum potential between electrodes is approximately 400 volts, and the maximum current between electrodes is approximately 150 milliamperes.

It will be apparent to skilled persons that many changes may be made to details of the specific embodiments of the invention described herein without departing from the underlying principles thereof. The scope of the invention should, therefore, be determined only by the following claims.

We claim:

1. An electrode structure for an addressing structure using an ionizable gaseous medium, the electrode structure comprising:

an insulating substrate;

a dielectric cover;

plural nonintersecting, spaced-apart channel-defining portions extending between the substrate and the cover and defining plural pairs of adjacent channel-defining portions, each channel-defining portion having two exposed surfaces exposed to the gaseous medium, each pair of adjacent channel-defining portions defining a plasma discharge channel between opposing exposed surfaces of the pair and portions of the substrate and the cover between the opposing surfaces, each of the channel-defining portions including:

an electrically conductive electrode included in only that one of the channel-defining portions and having a first surface which forms a part of one of the two exposed surfaces of that channel-defining portion and a second surface which forms a part of the other of the two exposed surfaces of that channel-defining portion, and an insulating wall between the electrode and the cover, wherein for each of plural pairs of adjacent channel-defining portions, the electrode included in one of the pair has a substantial degree of transparency to electromagnetic radiation having a wavelength in a predetermined range and the electrode included in the other of the pair does not have the substantial degree of transparency; and plural drivers operable in each of successive firing time intervals to place on the electrodes contained in a corresponding one of the pairs of adjacent channel-defining portions respective first and second electrical signals sufficient to initiate ionization of the gaseous medium in the channel defined in part by the corresponding one of the pairs.

2. The electrode structure of claim 1, wherein in plural pairs of adjacent channel-defining portions the electrode that has the substantial degree of transparency comprises indium tin oxide.

3. The electrode structure of claim 1, wherein predetermined ones of the electrodes comprise:

a conduction bus formed of a first electrically conductive material, and a distribution bus formed of a second electrically conductive material, the distribution bus electrically coupled to the conduction bus.

4. The electrode structure of claim 3, wherein the distribution bus has a substantial degree of transparency to electromagnetic radiation having a wavelength in a predetermined range.

5. The electrode structure of claim 4, wherein the distribution bus comprises indium tin oxide.

6. The electrode structure of claim 4, wherein the conduction bus does not have the substantial degree of transparency.

7. The electrode structure of claim 1, wherein each insulating wall comprises an insulating fiber.

8. The electrode structure of claim 7, wherein the fiber comprises a glass fiber.

9. The electrode structure of claim 8, wherein the electrode of each channel-defining portion bonds the glass fiber of that channel-defining portion to the substrate.

10. The electrode structure of claim 9, wherein each electrode comprises fused nickel paste frits.

11. The electrode structure of claim 7, wherein the fiber comprises an optical fiber.

12. The electrode structure of claim 7, wherein the electrode of each channel-defining portion bonds the fiber of that channel-defining portion to the substrate.

* * * * *